(12) United States Patent
Popovich et al.

(10) Patent No.: US 8,988,839 B2
(45) Date of Patent: Mar. 24, 2015

(54) BLOCK POWER SWITCH WITH EMBEDDED ELECTROSTATIC DISCHARGE (ESD) PROTECTION AND ADAPTIVE BODY BIASING

(75) Inventors: Mikhail Popovich, San Diego, CA (US); Yuan-Cheng Pan, Portland, OR (US); Boris D. Andreev, San Diego, CA (US); Junmou Zhang, Chandler, AZ (US); Reza Jalilizeinali, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 191 days.

(21) Appl. No.: 13/286,498

(22) Filed: Nov. 1, 2011

(65) Prior Publication Data

US 2013/0105951 A1     May 2, 2013

(51) Int. Cl.
| | |
|---|---|
| H02J 9/04 | (2006.01) |
| H01L 27/02 | (2006.01) |
| H02H 9/04 | (2006.01) |
| H03K 19/003 | (2006.01) |

(52) U.S. Cl.
CPC .......... *H01L 27/0251* (2013.01); *H02H 9/046* (2013.01); *H03K 19/00361* (2013.01)
USPC .............................. 361/56; 257/355; 257/491

(58) Field of Classification Search
None
See application file for complete search history.

(56) References Cited

U.S. PATENT DOCUMENTS

| | | | | |
|---|---|---|---|---|
| 6,236,250 | B1 * | 5/2001 | Salmon et al. ............... | 327/143 |
| 8,400,743 | B2 * | 3/2013 | Kosonocky et al. .......... | 361/56 |
| 2003/0214769 | A1 * | 11/2003 | Nishikawa et al. ........... | 361/56 |
| 2003/0235022 | A1 * | 12/2003 | Lai et al. ..................... | 361/111 |
| 2004/0196724 | A1 * | 10/2004 | Chen et al. ............... | 365/230.05 |
| 2006/0114047 | A1 * | 6/2006 | Irino ............................ | 327/328 |
| 2006/0214722 | A1 * | 9/2006 | Hirose et al. ................. | 327/407 |
| 2007/0133137 | A1 | 6/2007 | Dornbusch | |
| 2007/0188952 | A1 * | 8/2007 | Ker et al. ..................... | 361/56 |
| 2008/0062599 | A1 * | 3/2008 | Kato ........................... | 361/56 |
| 2009/0194322 | A1 * | 8/2009 | Usui et al. ................... | 174/260 |
| 2009/0231021 | A1 | 9/2009 | Koyama et al. | |
| 2009/0310267 | A1 * | 12/2009 | Gauthier et al. ............. | 361/56 |
| 2009/0316316 | A1 * | 12/2009 | Shiota ......................... | 361/56 |
| 2011/0255200 | A1 | 10/2011 | Tsai et al. | |
| 2012/0075758 | A1 * | 3/2012 | Pugsley ....................... | 361/56 |
| 2012/0299636 | A1 * | 11/2012 | Van Winkelhoff et al. ... | 327/434 |

FOREIGN PATENT DOCUMENTS

| | | |
|---|---|---|
| GB | 2464771 A | 5/2010 |
| JP | 2009076664 A * | 4/2009 |

OTHER PUBLICATIONS

International Search Report and Written Opinion—PCT/US2012/063095—ISA/EPO—Mar. 26, 2013.

* cited by examiner

*Primary Examiner* — Zandra Smith
*Assistant Examiner* — Molly Reida
(74) *Attorney, Agent, or Firm* — Nicholas J. Pauley; Peter Michael Kamarchik; Joseph Agusta

(57) ABSTRACT

A block power switch may be embedded with electrostatic discharge (ESD) protection circuitry. A transistor portion of the block power switch may be allocated to act as part of ESD protection circuitry and may be combined with an RC clamp to provide ESD protection. Adaptive body biasing (ABB) may be applied to the block power switch to reduce on-chip area and decrease leakage current of the block power switch.

18 Claims, 8 Drawing Sheets

BLOCK POWER SWITCH WITH EMBEDDED ELECTROSTATIC DISCHARGE (ESD) PROTECTION AND ADAPTIVE BODY BIASING

TECHNICAL FIELD

The present disclosure generally relates to integrated circuits (ICs). More specifically, the present disclosure relates to electrostatic discharge (ESD) protection of integrated circuits.

BACKGROUND

Electrostatic discharge (ESD) events are a common part of everyday life and some of the larger discharges are detectable by humans. ESD is a transient surge in voltage (negative or positive) that may induce a large current in a circuit. Smaller discharges often go unnoticed because the ratio of discharge strength to surface area over which the discharge occurs may be very small.

Integrated circuits (ICs) have been shrinking at an incredible rate over past decades. As transistors shrink in size, the supporting components around transistors generally shrink as well. The shrinking of IC dimensions decreases the ESD tolerance of transistors thereby increasing the sensitivity of integrated circuits to ESD stress.

An ESD event occurs when an object at a first potential comes near or into contact with an object at a second potential. Rapid transfer of charge from the first object to the second object occurs such that the two objects are at approximately equal potential. Where the object with lower charge is an integrated circuit, the discharge attempts to find the path of least resistance through the integrated circuit to a ground. Often, this path flows through interconnects. Parts of this path that are unable to withstand the energy associated with the discharge may sustain damage, potentially rendering the integrated circuit unfit for use.

ESD is a major concern for integrated circuits. To protect circuits against damage from ESD surges, protection schemes attempt to provide a discharge path for both positive and negative ESD surges. Conventional diodes may be employed in ESD protection circuits to clamp the voltage of positive and negative ESD surges to shunt current and prevent excessive voltage from being applied to a protected circuit. FIG. 1 illustrates a conventional ESD protection circuit in this regard. As illustrated in FIG. 1, a voltage rail (Vdd) 10 and a ground rail (GND) 12 are provided to power a protected circuit 14. In this example, a terminal in the form of a signal pin 16 provides a signal path to the protected circuit 14 for providing information and/or control to the protected circuit 14. For example, the protected circuit 14 may be included in an IC, with the signal pin 16 being an externally available pin on the IC.

A conventional ESD protection circuit 18 may be coupled between the voltage rail 10 and ground rail 12 to protect the protected circuit 14 from ESD surges. The exemplary ESD protection circuit 18 in FIG. 1 includes two conventional diodes: a positive ESD surge diode 20 and a negative ESD surge diode 22. The positive ESD surge diode 20 and the negative ESD surge diode 22 are coupled in series. The positive ESD surge diode 20 clamps positive voltage on the signal pin 16 to one diode drop above the voltage rail 10. The negative ESD surge diode 22 clamps negative voltage on the signal pin 16 to one diode drop below the ground rail 12. A cathode (k) of the positive ESD surge diode 20 is coupled to the voltage rail 10. An anode (a) of the positive ESD diode 20 is coupled to the signal pin 16 at a node 24 on the signal path between the signal pin 16 and the protected circuit 14. A cathode (k) of the negative ESD surge diode 22 is also coupled to the node 24 on the signal path from the signal pin 16 to the protected circuit 14. An anode (a) of the negative ESD surge diode 22 is coupled to the ground rail 12.

For positive ESD surges on the signal pin 16, the positive ESD surge diode 20 will become forward biased and clamp voltage on the signal pin 16 to one diode drop above the voltage rail 10 to protect the protected circuit 14. Energy from such an ESD surge will be conducted through the positive ESD surge diode 20 in a forward biased mode and dispersed into the voltage rail 10. Appropriate ESD protection structures may be implemented (not shown) in the voltage rail 10 to eventually dissipate a positive ESD surge to the ground rail 12. For negative ESD surges on the signal pin 16, the surge is similarly dissipated. A negative ESD surge on the signal pin 16 will place the negative ESD surge diode 22 in a forward biased mode thus providing a low-impedance path relative to the protected circuit 14. Energy from the negative ESD surge will be dissipated into the ground rail 12.

Although not depicted, other types of conventional ESD circuitry may involve a resistor-capacitor (RC) clamp to provide ESD protection.

Conventional ESD protection structures are designed to ensure high voltage protection and fast response times. However, a considerable amount of area (tens to thousands of square microns for each ESD protection structure) of an integrated circuit is consumed by ESD protection structures that might otherwise be available for active circuitry. To meet increasing demand in integrated circuits for smaller form factors, ESD protection circuit size should be reduced.

BRIEF SUMMARY

A power switch for use in a circuit block is offered. The power switch includes electrostatic discharge protection circuitry. The power switch also includes power switch circuitry sharing at least one component with the electrostatic discharge protection circuitry.

A method of manufacturing a circuit is offered. The method includes depositing electrostatic discharge protection circuitry. The method also includes depositing power switch circuitry sharing at least one component with the electrostatic discharge protection circuitry.

An apparatus is offered. The apparatus includes electrostatic discharge protection means. The apparatus also includes power switch means sharing at least one component with the electrostatic discharge protection means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Generally, distributed power switches (DPS) are used to reduce power consumption of inactive circuit blocks by effectively disconnecting global ground or power. Likewise, a block power switch (BPS)—a cluster of distributed power switches placed in a smaller area—may also be used for power reduction. However, because one or several nodes of a block power switch are connected to the power pin, which may be exposed to external electrostatic events, proper ESD protection is desired.

An ESD circuit employs large devices to withstand high magnitude current during an ESD event. With block power switch devices, the effective size of the power transistor is comparable to the size of the devices in ESD protection circuits. This, it may be advantageous to employ ESD protection embedded in the block power switch. Also, by combining the ESD protection with adaptive body biasing (ABB), the efficiency of the BPS is further increased. Adaptive body biasing refers to a voltage generated either on-chip or supplied externally to the body terminal of a block power switch.

According to aspects of the present disclosure, a block power switch with ESD protection and adaptive body biasing is described for power reduction in a multi-core system-on-chip design.

A block power switch is designed as a block (large NMOS or PMOS device) placed close to a circuit to control internal ground or power. The size of a block power switch is determined by the current sourced by the circuit block and tolerable voltage drop across the power switch. A large device (with effective ON resistance of a few milliohms) may be utilized. The resulting voltage drop in an active state is therefore negligible. In "sleep" mode, OFF resistance of the power switch is several orders of magnitude larger than the resistance of the circuit block, reducing leakage current.

Figure 1:
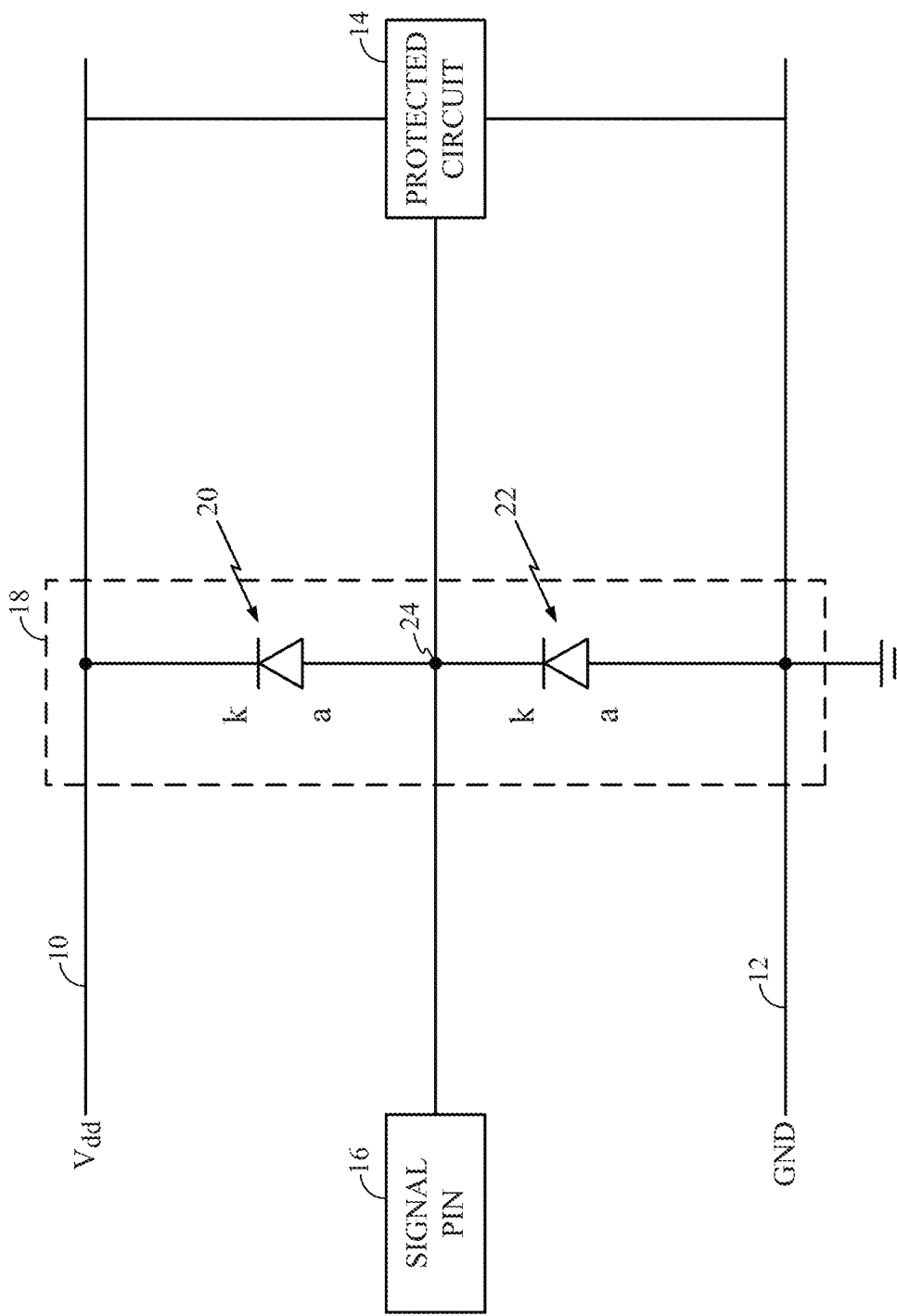
FIG. 1 is an example of a conventional electro-static discharge (ESD) protection circuit in the prior art.
Figure 2B:
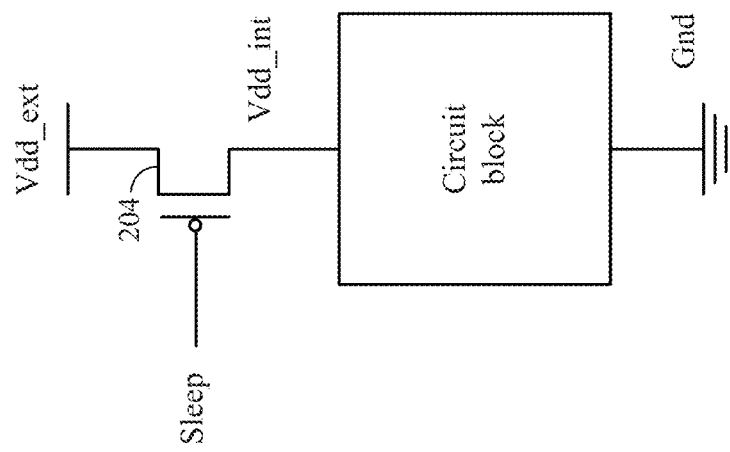
FIG. 2B shows generic structures of a head switch according to one aspect of the present disclosure.
Figure 2A:
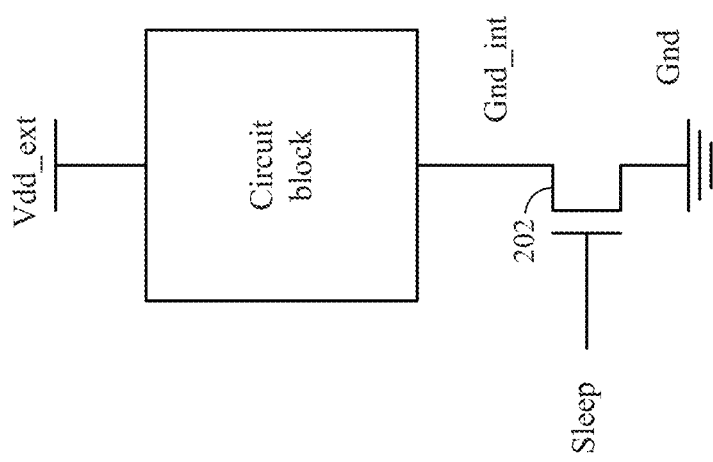
FIG. 2A shows generic structures of a foot switch according to one aspect of the present disclosure.

FIGS. 2A-B show generic implementations of a block power switch. External voltage (Vdd_ext) is defined as the external power supply rail voltage regulated by an external voltage regulator, which may come from batteries or other external sources. Internal voltage (Vdd_int) is defined as a voltage supply seen by the devices in the integrated circuit. In this disclosure, power switch refers to either a footswitch 202 (e.g., NMOS transistor) shown in FIG. 2A or a head switch 204 (e.g., PMOS transistor) shown in FIG. 2B.

Figure 3C:
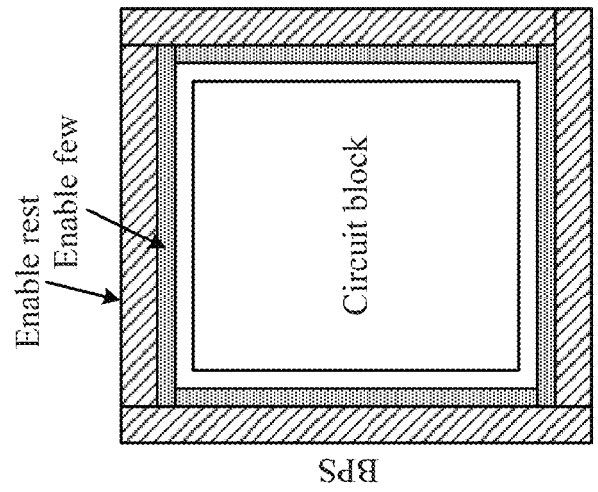
FIGS. 3A-C show a block power switch configurations, according to one aspect of the present disclosure.
Figure 3B:
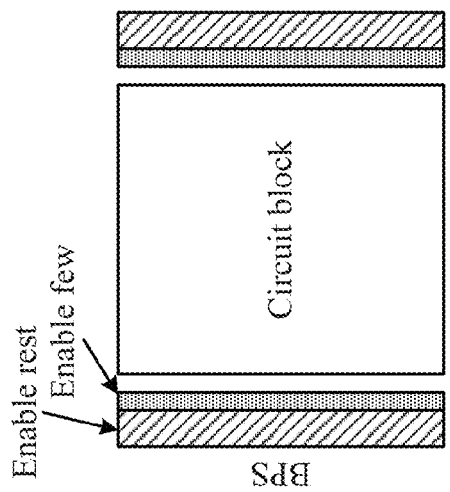
Figure 3A:
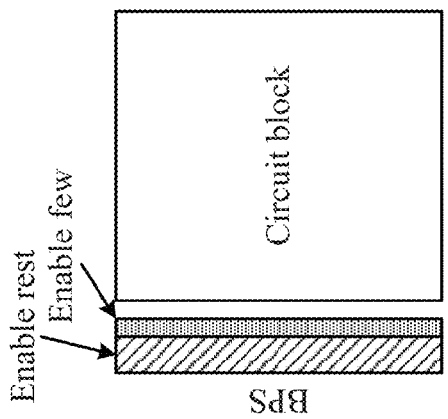

A block power switch implementation is depicted in FIGS. 3A-C. A block power switch is designed as a cluster of power switches such as NMOS transistors and PMOS transistors placed close to a circuit to control internal ground or power to the circuit. The size of the block power switch may be determined by the amount of current sourced by the circuit block and by the magnitude of a voltage drop that may be tolerated across the power switch. A large enough device (with an effective on resistance of a few milliohms) may be utilized so that the resulting voltage drop across the block power switch in an "active" state is negligible. In "sleep" mode, the off resistance of the block power switch is several orders of magnitude larger than the resistance of the circuit block, reducing leakage current. The block power switch may be placed either on one side of the circuit block (as shown in FIG. 3A), on opposite sides of the circuit block (as shown in FIG. 3B), or in a ring structure (as shown in FIG. 3C), for example.

To limit rush current when transitioning from "sleep" mode to "active" mode, according to aspects of the present disclosure, a two-stage or multi-stage wake-up strategy may be employed. According to the two stage wake-up strategy, a small number of the power switches in the block power switch are first turned on (indicated by the "enable few" annotations in FIGS. 3A-C). This pre-charges the parasitic capacitance of the circuit block. Next, the remainder of power switches in the block power switch (indicated by the "enable rest" annotations in FIGS. 3A-C) are activated. The two stage wake-up strategy provides a gradual state transition that limits transition current. Another advantage of utilizing a block power switch comes from the fact that all devices in a cluster supply current to various different areas of a circuit, This reduces areas of a die that are subject to excessive voltage fluctuations, thereby mitigating hot spots on a die.

Large devices may be used as block power switches to limit the voltage drop penalty in an active mode. According to aspects of the present disclosure, the block power switch may be effectively used as an active component of an ESD protection device, such as an Resistor-Capacitor (RC) clamp. That is, the active ESD protection device in a conventional ESD protection circuit may be replaced by a portion of a block power switch A Resistor-Capacitor (RC) clamp is designed to respond to sudden voltage changes (spikes) and does not limit the normal operation of the block power switch.

Figure 4:
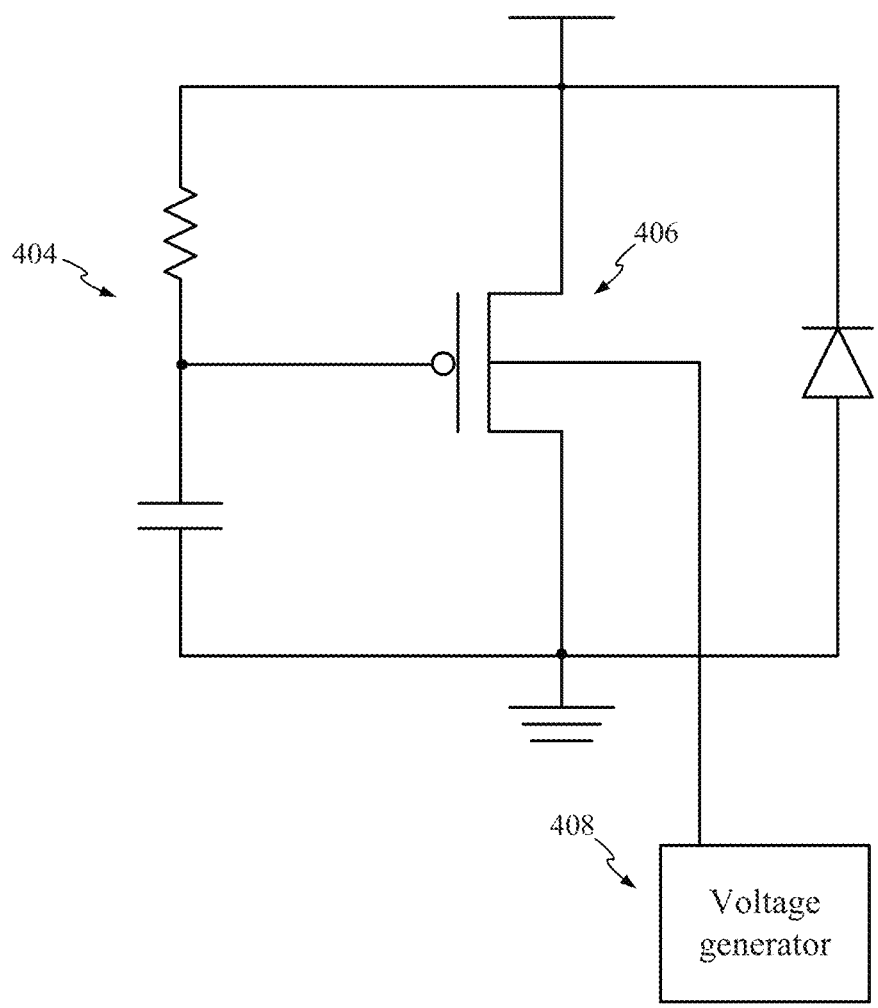
FIG. 4 shows a block power switch with embedded ESD protection and adaptive body biasing according to one aspect of the present disclosure.

In this aspect, embedded chip ESD circuitry may use one or more transistors that are also used for the block power switch. That is, the same transistor(s) may be used for two purposes, ESD protection and the block power switching. The block power switch may be a head switch (e.g., a PMOS transistor) or a foot switch (e.g., an NMOS transistor). By sharing a transistor (or multiple transistors) in this manner, chip area is saved. In one aspect, the RC clamp is provided inside the block power switch bank. In other aspects, the RC clamp as placed as a separate RC cell In another aspect, an adaptive body biasing (ABB) technique may be employed to increase the efficiency of the block power switch. As shown in FIG. 4, either an external voltage generator 408 or an on-chip biasing circuit (not shown) may be coupled directly to the transistor 406 to modulate the ON resistance and OFF resistance of the block power switch. One implementation of ABB is forward body biasing (FBB), in which the voltage generator 408 or biasing circuit applies a lower than power supply voltage to the PMOS transistor 406. Forward body biasing of the transistor 406 reduces, ON resistance of the block power switch. This permits the use of a smaller device to achieve an equal voltage drop across the block power switch. As a result, the on-chip area for the block power switch may be significantly reduced according to aspects of the present disclosure. Another implementation of ABB is reverse body biasing (RBB), in which the voltage generator 408 or biasing circuit applies a higher than power supply voltage to the PMOS transistor 406. Reverse body biasing of the transistor 406 increases off resistance of the block power switch. This further reduces leakage current in "sleep" mode according to aspects of the present disclosure.

Figure 5:
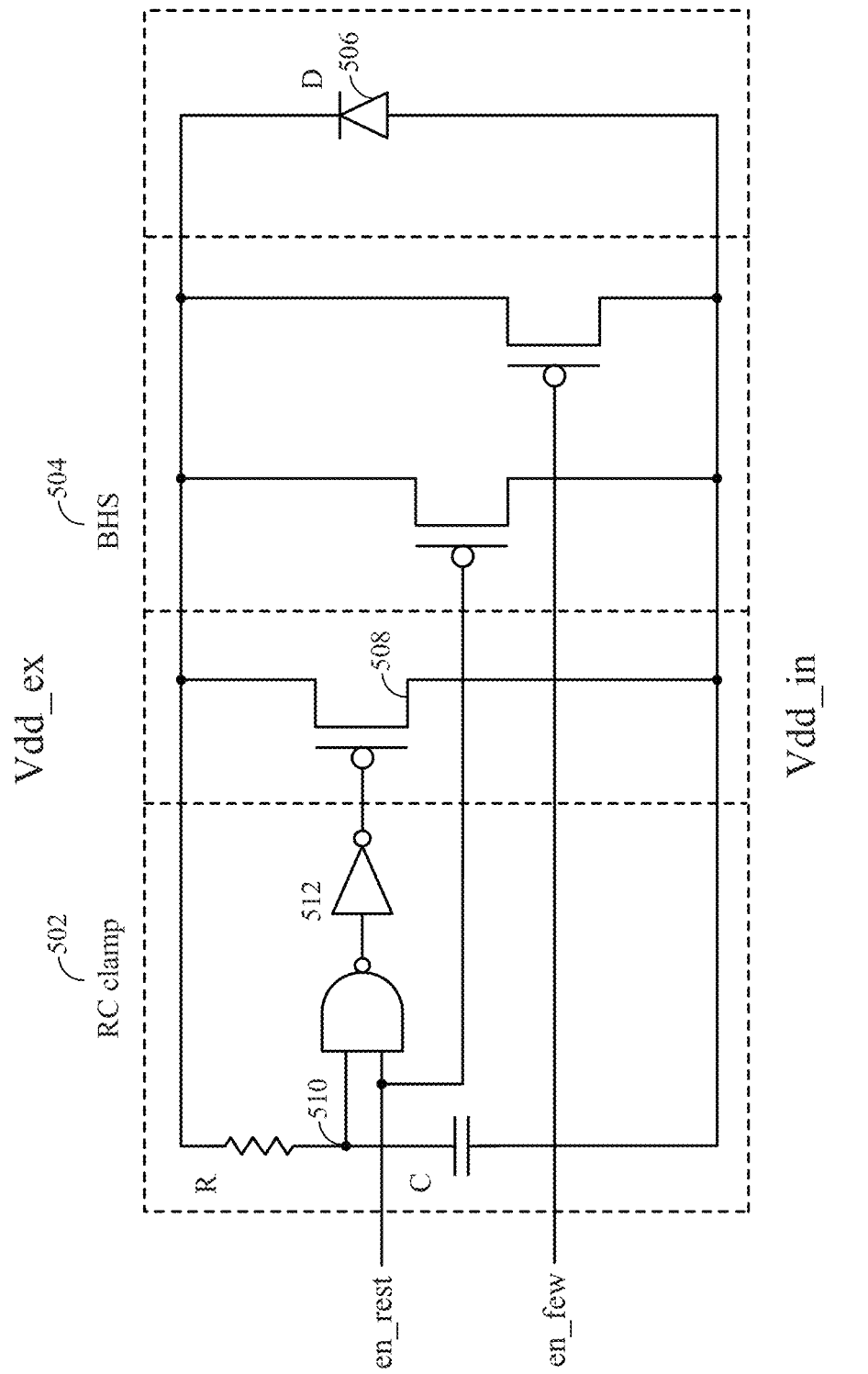
FIG. 5 shows block power switch with embedded ESD protection according to one aspect of the present disclosure.

FIG. 5 shows another aspect of a block power switch employing embedded ESD protection. FIG. 5 shows an RC clamp 502, a block head switch (BHS) 504, and an embedded diode 506 of the RC clamp 502. Although a block head switch is shown in FIG. 5, as noted above a block foot switch may be used as well. The block head switch 504 includes multiple stages to stagger current to the underlying circuit when turning on. That is, only some of the head switches open at one time. For example, a first head switch turns on when the signal en_few is asserted and the remaining head switches turn on when the signal en_rest is asserted.

During an ESD event at node 510, one of the transistors 508 of the BHS 504 operates as part of the RC clamp 502. That is, the transistor 508 of the BHS 504 may be used as an active device during ESD events to protect the underlying circuit. Circuitry 512 (e.g., a NAND gate and inverter) prioritizes the ESD event and transmits a signal to the gate of the transistor 508. The transistor 508 opens to prevent voltage overload to the underlying circuit. Depending on the polarity of an applied large magnitude voltage, the block power switch 504 either operates as a diode or the embedded diode 506 limits the current during an ESD event. The circuitry 512 also reacts to the signal en_rest to permit the transistor 508 to operate as part of the block head switch 504, when desired. Although a single transistor 508 is shown as being part of the RC clamp 502, of course multiple transistors from the power switch 504 can also be used. In one example, the transistor portion for ESD protection may be 3.5 mm wide, which is approximately 10% the width of a transistor block of a block power switch. Conventionally, an RC clamp 502 including one or more transistors may be located as a separate circuit. The above aspect may eliminate fabrication of a separate transistor of an RC clamp for ESD protection.

By employing aspects of this disclosure, effective leakage power reduction may be realized. Further, by utilizing at least a portion of the block power switch as an active device in ESD protection, chip area reduction may be realized. Further aspects of this disclosure result in area reduction and on resistance reduction by forward body biasing. Further aspects may realize leakage current reduction and off resistance increase by reverse body biasing.

Figure 6:
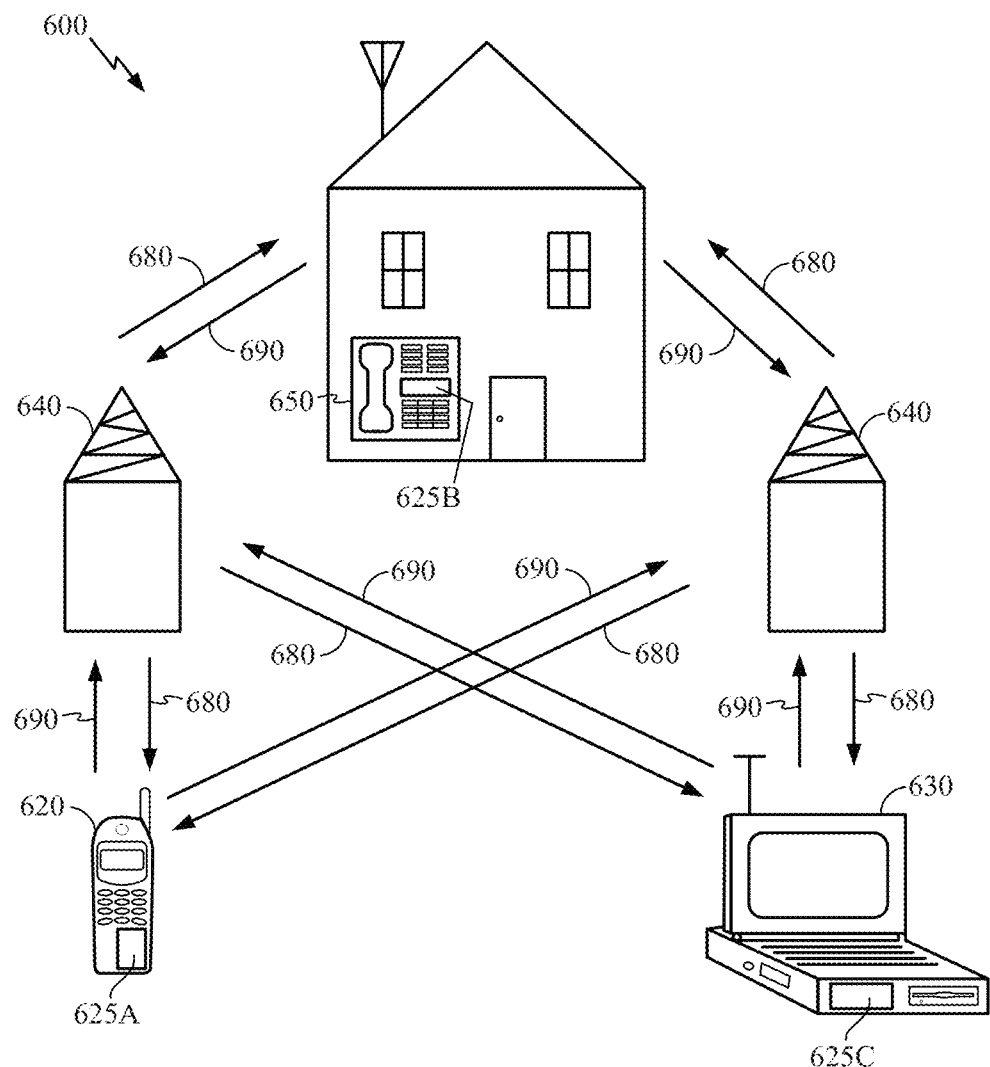
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 625B, which include the disclosed ESD protection. It will be recognized that devices containing an IC may also include the ESD protection disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, tablets, GPS enabled devices, navigation devices, set top boxes, music players, video players, entertainment units, fixed location data units such as meter reading equipment, or any other device that stores or retrieves data or computer instructions, or a combination thereof. Although FIG. 6 illustrates remote units according to the teachings of the disclosure, the disclosure is not limited to these exemplary illustrated units. Embodiments of the disclosure may be suitably employed in a device which includes ESD protection.

Figure 7:
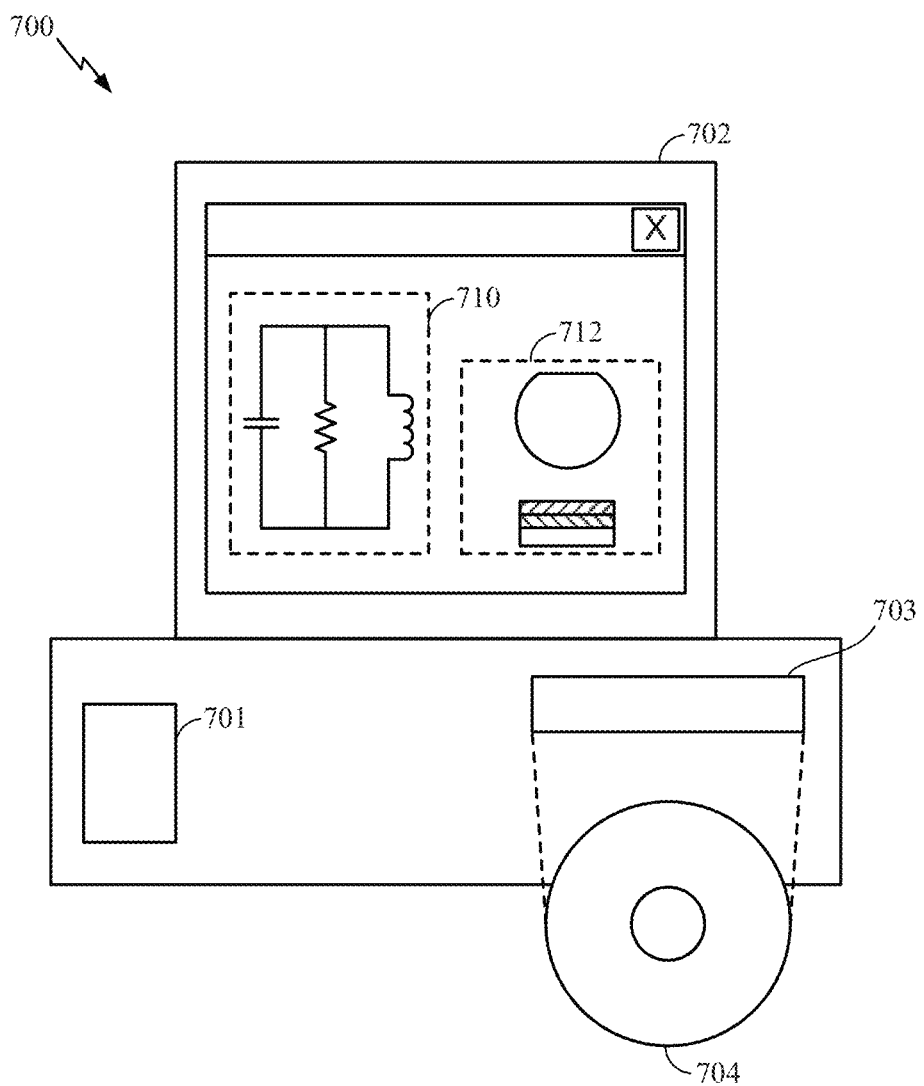
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, such as an ESD protection configuration as disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as a packaged integrated circuit having ESD protection. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

Figure 8:
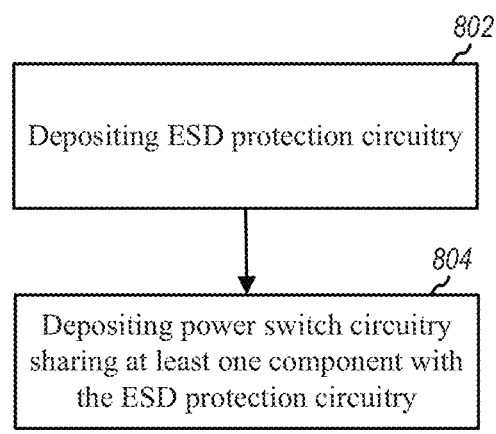
FIG. 8 describes an exemplary method for manufacturing circuits according to one aspect of the present disclosure.

FIG. 8 illustrates a method of manufacturing circuits according to one aspect of the present disclosure. As shown in block 802, electrostatic discharge (ESD) protection circuitry is deposited. As shown in block 804, power switch circuitry sharing at least one component with the ESD protection circuitry is deposited.

An apparatus may have means for electronic discharge protection. The means may include ESD protection circuitry described above. The apparatus may also include power switch means sharing at least one component with the ESD protection means. The power switch means may include head switch or foot switch circuitry as described above.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to a type of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can comprise RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that aspects of the disclosure may be practiced with portions of the disclosed circuitry. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A block power switch to provide an internal voltage to a circuit block, the block power switch comprising:
   a power switch, operable to turn on in response to an enable signal, the enable signal independent of an electrostatic discharge (ESD) event and independent of an external power supply rail voltage;
   ESD protection circuitry to open the power switch in response to the ESD event; and
   an ESD diode to couple the internal voltage to the external power supply rail voltage.

2. The block power switch of claim 1, the power switch comprising at least one transistor.

3. The block power switch of claim 2, further comprising adaptive body biasing circuitry coupled to the at least one transistor.

4. The block power switch of claim 1 in which the power switch comprises head switch circuitry.

5. The block power switch of claim 1 in which the power switch comprises foot switch circuitry.

6. The block power switch of claim 1, integrated into at least one of a mobile phone, a set top box, a music player, a video player, an entertainment unit, a navigation device, a computer, a hand-held personal communication systems (PCS) unit, a portable data unit, and a fixed location data unit.

7. An apparatus comprising:
   a power switch, operable to turn on in response to an enable signal, the enable signal independent of an electrostatic discharge (ESD) event and independent of an external power supply rail voltage;
   a means for ESD protection, the means for ESD protection to open the power switch in response to the ESD event; and
   an ESD diode to couple an internal voltage to the external power supply rail voltage.

8. The apparatus of claim 7, the power switch comprising at least one transistor.

9. The apparatus of claim 8, further comprising adaptive body biasing means coupled to the at least one transistor.

10. The apparatus of claim 7 in which the power switch comprises head switch means.

11. The apparatus of claim 7 in which the power switch comprises foot switch means.

12. The apparatus of claim 7, further comprising means for integrating the apparatus into at least one of a mobile phone, a set top box, a music player, a video player, an entertainment unit, a navigation device, a computer, a hand-held personal communication systems (PCS) unit, a portable data unit, and a fixed location data unit.

13. An apparatus comprising:
   a logic circuit configured to produce an output signal; and
   a first switch configured to be connected between a power supply and power supply input of a circuit to be protected and configured to receive, at a control terminal, the output signal, wherein the first switch is configured to be closed in response to the logic circuit receiving a first enable signal without concurrently receiving an electrostatic discharge; and
   wherein the logic circuit has a first input configured to receive the first enable signal and a second input configured to receive the electrostatic discharge; and
   a resistor connected to the second input and configured to be connected to the power supply; and
   a capacitor connected to the second input and configured to be connected to the power supply input of the circuit to be protected.

14. The apparatus of claim 13, wherein a voltage of the power supply is greater than a ground voltage and further comprising a diode having a cathode configured to be connected to the power supply and an anode configured to be connected to the power supply input of the circuit to be protected.

15. The apparatus of claim 13, wherein a voltage of the power supply is equal to a ground voltage and further comprising a diode having an anode configured to be connected to the power supply and a cathode configured to be connected to the power supply input of the circuit to be protected.

16. The apparatus of claim 13, further comprising a second switch configured to be connected between the power supply and the power supply input of the circuit to be protected and configured to receive, at a control terminal of the second switch, the first enable signal.

17. The apparatus of claim 13, further comprising a second switch configured to be connected between the power supply and the power supply input of the circuit to be protected and configured to receive, at a control terminal of the second switch, a second enable signal.

18. The apparatus of claim 13, wherein the logic circuit comprises:
 a NAND gate having a first input configured to receive the first enable signal, a second input configured to receive the electrostatic discharge, and an output configured to produce an intermediate signal; and
 an inverter configured to receive the intermediate signal and to produce the output signal.

* * * * *